(12) United States Patent
Yamada et al.

(10) Patent No.: US 12,090,578 B2
(45) Date of Patent: Sep. 17, 2024

(54) Al BONDING WIRE

(71) Applicants: NIPPON MICROMETAL CORPORATION, Saitama (JP); NIPPON STEEL Chemical & Material Co., Ltd., Tokyo (JP)

(72) Inventors: Takashi Yamada, Saitama (JP); Akihito Nishibayashi, Saitama (JP); Teruo Haibara, Saitama (JP); Daizo Oda, Saitama (JP); Motoki Eto, Saitama (JP); Tetsuya Oyamada, Tokyo (JP); Takayuki Kobayashi, Tokyo (JP); Tomohiro Uno, Tokyo (JP)

(73) Assignees: NIPPON MICROMETAL CORPORATION, Saitama (JP); NIPPON STEEL Chemical & Material Co., Ltd., Tokyo (JP)

(*) Notice: Subject to any disclaimer, the term of this patent is extended or adjusted under 35 U.S.C. 154(b) by 369 days.

(21) Appl. No.: 17/437,802

(22) PCT Filed: Mar. 12, 2020

(86) PCT No.: PCT/JP2020/010762
§ 371 (c)(1),
(2) Date: Sep. 9, 2021

(87) PCT Pub. No.: WO2020/184655
PCT Pub. Date: Sep. 17, 2020

(65) Prior Publication Data
US 2022/0152749 A1    May 19, 2022

(30) Foreign Application Priority Data
Mar. 13, 2019    (JP) ................. 2019-045670

(51) Int. Cl.
| | | |
|---|---|---|
| B23K 20/00 | (2006.01) | |
| B23K 35/00 | (2006.01) | |
| B23K 35/02 | (2006.01) | |
| B23K 35/28 | (2006.01) | |
| C22F 1/04 | (2006.01) | |
| H01L 23/00 | (2006.01) | |
| B23K 101/40 | (2006.01) | |

(52) U.S. Cl.
CPC ........ *B23K 35/0227* (2013.01); *B23K 20/004* (2013.01); *B23K 20/005* (2013.01); *B23K 20/007* (2013.01); *B23K 35/286* (2013.01); *C22F 1/04* (2013.01); *H01L 24/43* (2013.01); *H01L 24/45* (2013.01); *B23K 2101/40* (2018.08); *H01L 24/05* (2013.01); *H01L 2224/05124* (2013.01); *H01L 2224/05147* (2013.01); *H01L 2224/43848* (2013.01); *H01L 2224/43986* (2013.01); *H01L 2224/45015* (2013.01); *H01L 2224/45124* (2013.01)

(58) Field of Classification Search
CPC ............. B23K 35/0227; B23K 35/286; B23K 2101/40; B23K 35/0216–0227; B23K 35/0261; B23K 20/004; B23K 20/005; B23K 20/007; C22F 1/04; H01L 24/43; H01L 24/45; H01L 24/05; H01L 2224/05124; H01L 2224/05147; H01L 2224/43848; H01L 2224/43986; H01L 2224/45015; H01L 2224/45124; H01L 24/85; H01L 2224/05624; H01L 2224/85439; H01L 2924/386; C22C 21/02; C22C 21/00
USPC ...... 228/4.5, 180.5, 904, 56.3, 262.5–262.51
See application file for complete search history.

(56) References Cited

U.S. PATENT DOCUMENTS

| | | |
|---|---|---|
| 2010/0294532 A1 | 11/2010 | Uno et al. |
| 2014/0063762 A1 | 3/2014 | Ryu et al. |
| 2019/0267151 A1* | 8/2019 | Kusakari ............... B21C 9/00 |

FOREIGN PATENT DOCUMENTS

| | | | | |
|---|---|---|---|---|
| CN | 103781926 B | * | 8/2016 | ............ B82Y 30/00 |
| CN | 107978382 A | * | 5/2018 | ............ C22C 21/00 |
| CN | 108274008 A | * | 7/2018 | |
| CN | 108796403 A | * | 11/2018 | |
| CN | 109252072 A | * | 1/2019 | ............ C22C 1/026 |
| DE | 102017218957 A1 | * | 4/2018 | ............ C22C 21/00 |
| DE | 112017005471 T5 | * | 7/2019 | ............ C21D 9/525 |
| JP | H08-008288 A | | 1/1996 | |
| JP | 2002-314038 A | | 10/2002 | |

(Continued)

OTHER PUBLICATIONS

Machine translation of JP-2013258324A (no date available).*

(Continued)

*Primary Examiner* — Kiley S Stoner
(74) *Attorney, Agent, or Firm* — Rimon P.C.

(57) ABSTRACT

There is provided an Al bonding wire which can provide a sufficient bonding reliability of bonded parts of the bonding wire under a high temperature state where a semiconductor device using the Al bonding wire is operated. The bonding wire is composed of Al or Al alloy, and is characterized in that an average crystal grain size in a cross-section of a core wire in a direction perpendicular to a wire axis of the bonding wire is 0.01 to 50 μm, and when measuring crystal orientations on the cross-section of the core wire in the direction perpendicular to the wire axis of the bonding wire, a crystal orientation <111> angled at 15 degrees or less to a wire longitudinal direction has a proportion of 30 to 90% among crystal orientations in the wire longitudinal direction.

2 Claims, No Drawings

(56) References Cited

FOREIGN PATENT DOCUMENTS

| JP | 2008-218994 A | | 9/2008 | | |
|----|---|---|---|---|---|
| JP | 2008-311383 A | | 12/2008 | | |
| JP | 2009-158931 A | | 7/2009 | | |
| JP | 5159000 B1 | * | 3/2013 | ............. | H01L 24/43 |
| JP | 2013258324 A | * | 12/2013 | ............. | H01L 24/43 |
| JP | 2014-53610 A | | 3/2014 | | |
| JP | 2015-124409 A | | 7/2015 | | |
| WO | WO-2012008588 A1 | * | 1/2012 | ............. | B21C 1/003 |
| WO | WO-2013147270 A1 | * | 10/2013 | ............. | B21C 1/003 |
| WO | WO-2016047617 A1 | * | 3/2016 | ............... | B21C 1/02 |
| WO | 2016/091718 A1 | | 6/2016 | | |
| WO | WO-2018145503 A1 | * | 8/2018 | ............... | B21B 1/46 |
| WO | WO-2018181505 A1 | * | 10/2018 | ............. | C22C 21/02 |

OTHER PUBLICATIONS

Extended European Search Report issued in corresponding European Patent Application No. 20769131.2, dated May 23, 2023.

J.P. Hou et al., "Microstructure evolution and strengthening mechanisms of cold-drawn commercially pure aluminum wire," Materials Science and Engineering, 639, 2015, pp. 103-106.

International Search Report issued in corresponding International Patent Application No. PCT/JP2020/010762, dated Apr. 14, 2020, with English translation.

* cited by examiner

Al BONDING WIRE

CROSS-REFERENCE TO RELATED APPLICATIONS

This application is the U.S. National Phase under 35 U.S.C. § 371 of International Application No. PCT/JP2020/010762, filed on Mar. 12, 2020, which claims the benefit of Japanese Application No. 2019-045670, filed on Mar. 13, 2019, the entire contents of each are hereby incorporated by reference.

TECHNICAL FIELD

The present invention relates to an Al bonding wire.

BACKGROUND ART

In a semiconductor device, electrodes formed on a semiconductor element are connected with lead frames or electrodes on a substrate using a bonding wire. As for a material of the bonding wire, gold (Au) and copper (Cu) are used for an integrated circuit semiconductor device such as an ultra-LSI, while aluminum (Al) is mainly used for a power semiconductor device. For example, Patent Literature 1 discloses an example in which an aluminum bonding wire (hereinafter referred to as an "Al bonding wire") with a diameter of 300 μm is used in a power semiconductor module. In a power semiconductor device using an Al bonding wire, a wedge bonding is used as a bonding process for both of the connection with electrodes on semiconductor element and the connection with lead frames or electrodes on substrate.

A power semiconductor device using an Al bonding wire is often used as a semiconductor device for large power equipment such as air conditioner and photovoltaic power generation system, and for automotive. In these semiconductor devices, the bonded parts of Al bonding wire are exposed to high temperatures of 100 to 300° C. Since an Al bonding wire composed only of high purity Al tends to soften in such a high temperature environment, it is difficult to use such Al bonding wire in a high temperature environment.

Patent Literature 2 discloses an Al wire containing 0.02 to 1% by weight of Fe. In Al wires not containing Fe, recrystallization occurs just above the wire bonding interface at high temperature during use of semiconductor, and forms small crystal grains, which causes cracking. On the other hand, the recrystallization temperature can be increased if the wire contains 0.02% or more of Fe. By annealing after wire drawing, the wire crystal grain size before bonding is set to be 50 μm or more. It is described that there will be no occurrence of cracks since the crystal grain size is large and the recrystallization does not occur even at high temperature during use of semiconductors.

Patent Literature 3 discloses a bonding wire which enables a highly reliable connection part by suppressing the progression of cracks generated at the connection part even under a repeated application of high current during use. The bonding wire is characterized in that the wire material is Al-0.1 to 1 wt % X with X being at least one metal selected from Cu, Fe, Mn, Mg, Co, Li, Pd, Ag, and Hf, and the wire thickness (diameter) is 50 to 500 μm.

RELATED ART REFERENCE

Patent Literature

Patent. Literature 1: JP-A-2002-314038
Patent Literature 2: JP-A-HOE-8288
Patent Literature 3: JP-A-2008-311383

SUMMARY OF INVENTION

Problem to be Solved by the Invention

Even for semiconductor devices using an Al bonding wire of pure Al or an Al bonding wire of Al alloy as described in Patent Literatures 2 and 3, sufficient bonding reliability of the bonded parts of the bonding wire was sometimes not achieved under a high temperature state where the semiconductor device was operated.

An object of the present invention is to provide an Al bonding wire which achieves sufficient bonding reliability of the bonded parts of the bonding wire under high temperature state where a semiconductor device using the Al bonding wire is operated.

Means for Solving Problem

That is, the summary of the present invention is as follows.

[1] A bonding wire of Al or Al alloy, wherein
an average crystal grain size in a cross-section in a direction perpendicular to a wire axis of the bonding wire is 0.01 to 50 μm, and
when measuring crystal orientations on the cross-section in the direction perpendicular to the wire axis of the bonding wire, a crystal orientation <111> angled at 15 degrees or less to a wire longitudinal direction has a proportion of 30 to 90% among crystal orientations in the wire longitudinal direction.

[2] The bonding wire according to [1], wherein a hardness of the wire is 20 to 40 in terms of Hv.

[3] The bonding wire according to [1] or [2], wherein a wire diameter is 50 to 600 μm.

Effect of the Invention

The present invention can achieve a sufficient bonding reliability of bonded parts of the bonding wire under a high temperature state where a semiconductor device using the Al bonding wire is operated.

EMBODIMENT FOR CARRYING OUT THE INVENTION

As for the semiconductor device using an Al bonding wire of pure Al or Al alloy as described in Patent Literatures 2 and 3, when the semiconductor device was operated for a long time under a high temperature state, there was observed a phenomenon in which the bonding strength of the bonded parts of the bonding wire decreased. In other words, it was found that sufficient bonding reliability cannot be achieved. According to the observation of the cross-section of the bonding wire in the semiconductor device after long-term operation under a high temperature, it was found that recrystallization occurred and the crystal grain size increased due to a high temperature environment, and a crystal orientation <111> Proportion, which will be described later, was reduced. It was therefore inferred that the wire strength was reduced as compared to the initial strength, resulting in an occurrence of peeling phenomenon at the bonding interface and a decrease in the reliability of the bonded parts.

In contrast, the Al bonding wire of the present invention is characterized in that an average crystal grain size in a cross-section in a direction perpendicular to a wire axis of the bonding wire is 0.01 to 50 μm, and when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction. Hereinafter, such proportion of a crystal orientation <111> may also be simply referred to as "crystal orientation <111> proportion". Thus, even when the semiconductor device is continuously operated for a long time under a high temperature environment, it is possible to ensure the reliability of the bonded parts in the semiconductor device after long-term operation under a high temperature. A detailed description will next be given.

There will be described an evaluation test of reliability of the bonded parts after a high-temperature long-term hysteresis.

As an Al bonding wire, an Al bonding wire of an Al alloy containing 0.5% by mass of Fe and an Al bonding wire of pure Al were used. The wire diameter after wire drawing is 200 μm. In the middle of the wire drawing process, some of the wires were subjected to a heat treatment. When the heat treatment was performed, two types of cooling conditions had been employed including slow cooling and quenching. The wires after being drawn were subjected to a thermal refining heat treatment. Thus, the Vickers hardness of the bonding wire was adjusted to be Hv 40 or less. By varying the condition of heat treatment in the middle of wire drawing and the condition of thermal refining heat treatment after wire drawing, the crystal grain size and the crystal orientation <111> proportion of the wire were variously changed.

In the semiconductor device, both the first bonded part between the semiconductor chip and the bonding wire and the second bonded part between the external lead and the bonding wire utilized wedge bonding.

The high-temperature long-term hysteresis was performed by power cycle test. The power cycle test involves repeatedly heating and cooling the semiconductor device in which the Al bonding wires are bonded. Specifically, the semiconductor device is heated over 2 seconds until the temperature of the bonded parts of the bonding wires in the semiconductor device becomes 140° C., and then is cooled over 5 seconds until the temperature of the bonded parts becomes 30° C. This heating and cooling cycle is repeated 200,000 times.

After performing the high-temperature long-term hysteresis as noted above, the bonding shear strength of the first bonded part was measured to evaluate the reliability of the bonded part. As a result, when the average crystal grain size in a cross-section in a direction perpendicular to a wire axis of the bonding wire is 0.01 to 50 μm, and the crystal orientation <111> proportion falls within a range of 30 to 90% (condition of the present invention), both the wire of Al alloy and the wire of pure Al had a bonding shear strength of 90% or more compared to the initial strength, so that the sufficient reliability of the bonded parts could be ensured. On the other hand, when the average crystal grain size and the crystal orientation <111> proportion were out of the condition of the present invention as noted above, the bonding shear strength was less than 50% compared to the initial strength, and the reliability of the bonded parts was insufficient.

<<Average Crystal Grain Size of Wire>>

In the present invention, the average crystal grain size in the cross-section of the core wire in the direction perpendicular to the wire axis of the bonding wire (cross section in a direction perpendicular to the wire axis; cross section (C-section) perpendicular to the longitudinal direction of the wire) is 0.01 to 50 μm. As for a measuring method of the average crystal grain size, a measuring method such as EBSD (Electron Back Scatter Diffraction Patterns) is used to determine the area of each crystal grain and then to calculate the average of diameter of each crystal grain on the supposition that each crystal grain is a circle.

When the average crystal grain size is 0.01 μm or more, recrystallization due to the thermal refining heat treatment during wire drawing proceeds moderately, and the wire is softened. Thus, it is possible to prevent the wire from: chip cracking during bonding; having a lower bonding property of the bonded parts; having a decreased reliability during a high-temperature long-term use, and the like. On the other hand, the average crystal grain size exceeding 50 μm indicates that the recrystallization of the wire has proceeded too much. Thus, the reliability during a high-temperature long-term use is reduced. By Performing the thermal refining heat treatment during wire drawing, it is possible to adjust the average crystal grain size in the C-section of the wire to be 0.01 to 50 μm. The average crystal grain size is preferably 0.05 μm or more, and more preferably 0.1 μm or more. The average crystal grain size is also preferably 20 μm or less, and more preferably 10 μm or less.

<<Crystal Orientation <111> Proportion of Wire>>

When measuring crystal orientations on a cross-section of the core wire in a direction perpendicular to a wire axis of the bonding wire of the present invention, a crystal orientation <111> angled at 15 degrees or less to a wire longitudinal direction has a proportion of 30 to 90% among crystal orientations in the wire longitudinal direction. Herein, the cross-section of the core wire in a direction perpendicular to a wire axis means a cross-section (C-section) perpendicular to the longitudinal direction of the bonding wire. For the measurement of the crystal orientation <111> proportion, EBSD can be used. The crystal orientation <111> proportion can be calculated by inspecting the cross-section of the core wire in a direction perpendicular to a wire axis (cross-section in a direction perpendicular to a wire axis; cross-section perpendicular to the longitudinal direction of the bonding wire) as an inspection surface, and using an analysis software dedicated to the measuring device. Regarding the calculation method of the orientation proportion, the crystal orientation <111> proportion is defined as the areal percentage of crystal orientation <111> which is calculated by using, as a population, only the area where crystal orientation can be identified with a certain reliability within the measurement area. In the process of determining the orientation proportion, there is excluded a portion where crystal orientation cannot be measured or a portion where the reliability of orientation analysis is low even when crystal orientation can be measured.

If the crystal <111> orientation proportion is 90% or less, recrystallization due to the thermal refining heat treatment during wire drawing proceeds moderately, and the wire is softened. Thus, it is possible to prevent the wire from: chip cracking during bonding; having a lower bonding property of the bonded parts; having a decreased reliability during a high-temperature long-term use, and the like. On the other hand, the crystal orientation <111> proportion of less than 30% indicates that the recrystallization of the wire has proceeded too much. Thus, the reliability of the bonded parts is reduced, and the reliability during a high-temperature long-term use is also reduced.

By performing the heat treatment during wire drawing, and quenching after heat treatment in combination with the thermal refining heat treatment after wire drawing, the crystal orientation <111> proportion in a cross-section perpendicular to the longitudinal direction of the wire can be adjusted to 30 to 90%. The crystal orientation <111> proportion is preferably 60% or more, and more preferably 70% or more. The crystal orientation <111> proportion is also preferably 25% or less, and more preferably 80% or less.

<<Vickers Hardness of Wire>>

In the present invention, the Vickers hardness in the cross section (C-section) perpendicular to the wire longitudinal direction of the bonding wire is preferably from Hv20 to 40. When the Vickers hardness is Hv40 or less, a favorable bonding property can be achieved without generating a chip crack during bonding. In addition, loops can be easily formed to provide wiring to the semiconductor device. On the other hand, the Vickers hardness of less than Hv20 indicates that the recrystallization of the wire has proceeded too much. Thus, even if precipitates are formed by aging heat treatment, it is difficult to obtain sufficient strength, and as a result, the reliability of the bonded parts may decline. Therefore, the lower limit of the Vickers hardness is preferably Hv20. As described above, the Vickers hardness of the wire can be adjusted to the range of Hv20 to 40 by performing the heat treatment during manufacture of wire, and further by performing the thermal refining heat treatment during the process of wire drawing.

<<Wire Diameter>>

In the present invention, the diameter of the bonding wire is preferably 50 to 600 μm. Wires with diameter of 50 μm or more are generally used for power system devices due to a large current flow. Wires with diameter exceeding 600 μm are difficult to handle and no wire bonders are available for them. Thus, wires with diameter of 600 μm or less are used.

<<Components of Wire>>

For the Al bonding wire of the present invention, any of pure Al and an Al alloy can be appropriately applied. The Al alloy may contain an additive element such as Fe, Si, or the like, and examples thereof may include an Al—Fe alloy and an Al—Si alloy. The Al content thereof is preferably 95% by mass or more, 96% by mass or more, 97% by mass or more, 98% by mass or more, or 93.5% by mass or more. Preferable examples of the Al alloy may include an alloy of Al-0.5% by mass Fe and an alloy of Al-1% by mass Si.

<<Method for Manufacturing Bonding Wire>>

The bonding wire of the present invention is manufactured by obtaining an Al alloy containing Predetermined components, followed by performing a heat treatment during wire drawing in addition to the rolling and wire drawing as the common procedure.

During wire drawing, a heat treatment and a subsequent quenching treatment are performed. The heat treatment can be performed at a stage when the wire diameter is about 1 mm. The condition of the heat treatment during wire drawing preferably 600 to 640° C. for 2 to 3 hours. The quenching treatment after the heat treatment is performed in water. When the heat treatment is not conducted, the crystal orientation <111> proportion exceeds the upper limit after the thermal refining heat treatment described below. Further, if the wire is cooled slowly even when the heat treatment is conducted or the heat treatment is performed at too high temperature, the crystal orientation <111> proportion is below the lower limit after the thermal refining heat treatment described below.

The thermal refining heat treatment is performed during and/or after the wire drawing. It is possible to increase the average crystal grain size, to reduce the crystal orientation <111> proportion, and to reduce the Vickers hardness by increasing the temperature of the thermal refining heat treatment and extending the time thereof. The condition of the thermal refining heat treatment can be determined within a range of 250 to 350° C. for the heat treatment temperature and within a range of 5 to 15 seconds for the heat treatment time so as to realize a preferable average crystal grain size, crystal orientation <111> proportion, and Vickers hardness.

EXAMPLES

Implementation Example 1

Al alloy containing 0.5 A % by mass of Fe was prepared. The alloy was used to form an ingot, and was subjected to groove roll rolling, followed by wire drawing. The resulting wire was subjected to a heat treatment at a stage when the wire diameter was 800 μm. After that, the wire was subjected to a wire drawing with dies, so as to have a final wire diameter shown in Table 1. After the completion of the wire drawing, a thermal refining heat treatment was performed. The conditions of the heat treatment during wire drawing were as follows. The standard condition was 620° C. for 3 hours with quenching (water cooling). A part of the wires was not subjected to the heat treatment (Comparative Example 3), and another part thereof was subjected to slow cooling (air cooling) as the cooling condition (Comparative Example 4). Further, the conditions of the thermal refining heat treatment after wire drawing were as follows. The standard condition was within a range of 270±10° C. for 10 seconds. A part of the wires was treated at a lower temperature than that of the standard condition (Comparative Example 1) and another part thereof was treated at a higher temperature than that of the standard condition (Comparative Example 2). In Working Examples 1 to 9, the temperature of the thermal refining heat treatment was varied within the standard condition.

For the resultant wires, an average crystal grain size, a proportion of a crystal orientation <111> angled at 15 degrees or less to a wire longitudinal direction ("crystal orientation <111> proportion"), and the Vickers hardness were measured on a cross-section (C-section) of the core wire in a direction perpendicular to a wire axis.

The average crystal grain size was measured by determining the area of each crystal grain using an EBSD method, converting the area of each crystal grain into the area of a circle, and averaging diameters of the converted circles.

The measurement of the crystal orientation <111> proportion was performed by measuring with EBD on a cross-section of the core wire in a direction perpendicular to a wire axis (cross-section perpendicular to the longitudinal direction of the bonding wire), and calculating the crystal orientation <111> proportion in the above-described procedure using the analysis software dedicated to the measuring device.

The Vickers hardness was measured as the hardness of the center position of the C-section in radial direction using a micro-Vickers hardness meter.

In the semiconductor device, the electrode on the semiconductor chip was Al—Cu, and the external terminal was Ag. Both the first bonded parts between the electrode on the semiconductor chip and the bonding wire and the second bonded parts between the external terminal and the bonding wire utilized wedge bonding.

The bonding property of the bonding wire in the semiconductor device was evaluated by the presence or absence of initial bonding failure (before a high-temperature long-term hysteresis) of the first bonded parts. In the evaluation, a case being bonded was marked with a symbol of "circle", and a case being not bonded was marked with a symbol of "cross" in the column "bonding property" in Table 1.

The evaluation of chip crack in the semiconductor device was performed by dissolving metal of the pad surface with an acid, and observing the presence or absence of chip cracks under the pad using a microscope. In the evaluation, no presence of cracks was marked with a symbol of "circle", some presence of cracks was marked with a symbol of "cross" in the column "chip crack" in Table 1.

The high-temperature long-term hysteresis was performed by a power cycle test. The power cycle test involved repeatedly heating and cooling the semiconductor device in which an Al bonding wire had been bonded. Specifically, the semiconductor device was heated over 2 seconds until the temperature of the bonded parts of the bonding wires in the semiconductor device became 140° C., and then was cooled over 5 seconds until the temperature of the bonded parts became 30° C. This heating and cooling cycle was repeated 200,000 times.

After performing the high-temperature long-term hysteresis, the bonding shear strength of the first bonded part was measured to evaluate the reliability of the bonded part. The shear strength was measured as a comparison with the initial shear strength of the bonded part. in the evaluation, the shear strength being 95% or more of the initial bonding strength was marked with a symbol of "double circle", being 90% to 95% of the initial bonding strength was marked with a symbol of "circle", being 70% to 90% of the initial bonding strength was marked with symbol of "triangle", and being less than 70% of the initial bonding strength was marked with a symbol of "cross" in the column "reliability test" in Table 1. The evaluation of "cross" was determined to be unacceptable.

treatment was altered within the standard condition. For the wires having the same wire diameter, as the temperature of the thermal refining heat treatment is higher within the standard condition, the crystal grain size tends to be larger and the crystal orientation <111> proportion tends to be smaller. In particular, Working Example Nos. 1, 4 and 7 had the crystal grain size and the crystal orientation being within the most preferable ranges, and all of them achieved particularly favorable result (a symbol of "double circle") in the reliability test. Comparative Example Nos. 1 to 4 are comparative examples.

In Comparative Example No.1, the temperature of the thermal refining heat treatment was lower than that of the standard condition. In this case, the average crystal grain size was below the lower limit, the crystal, orientation <111> proportion was over the upper limit, and the hardness was higher than that of the preferable condition. All the results of bonding property, chip crack, and reliability test were unsatisfactory.

In Comparative Example No.2, the temperature of the thermal refining heat treatment was higher than that of the standard condition. In this case, the average crystal grain size exceeded the upper limit, the crystal orientation <111> proportion was below the lower limit, and the hardness was lower than that of the preferable condition. The result of the reliability test was unsatisfactory.

In Comparative Example No.3, a heat treatment during wire drawing was not conducted. In this case, the average crystal grain size was within the scope of the present invention, but the crystal orientation <111> proportion was over the upper limit, and the hardness was higher than that of the preferable condition. The result of the reliability test was unsatisfactory.

In Comparative Example No.4, the cooling after the heat treatment during wire drawing was slow cooling. In this case, the average crystal grain size was within the scope of the present invention, but the crystal orientation <111>

TABLE 1

| | | Manufacturing Method | | Wire Texture | | | | | |
| --- | --- | --- | --- | --- | --- | --- | --- | --- | --- |
| | | | | Thermal refining heat treatment | Crystal grain size | Crystal orientation <111> proportion | Wire Properties | | |
| | Wire diameter (μm) | Heat treatment during wire drawing | | | | | Hardness Hv | Bonding property | Chip crack | Reliability test |
| | | Temp. | Cooling | Temp. | (μm) | (%) | | | | |
| Working Example | 1 | 50 | Standard | Quenching | Standard | 9 | 73 | 38 | ○ | ○ | ◎ |
| | 2 | 50 | " | " | " | 17 | 59 | 26 | ○ | ○ | ○ |
| | 3 | 50 | " | " | " | 26 | 47 | 22 | ○ | ○ | ○ |
| | 4 | 200 | " | " | " | 8 | 79 | 35 | ○ | ○ | ◎ |
| | 5 | 200 | " | " | " | 18 | 61 | 26 | ○ | ○ | ○ |
| | 6 | 200 | " | " | " | 45 | 44 | 23 | ○ | ○ | ○ |
| | 7 | 600 | " | " | " | 10 | 73 | 39 | ○ | ○ | ◎ |
| | 8 | 600 | " | " | " | 16 | 56 | 29 | ○ | ○ | ○ |
| | 9 | 600 | " | " | " | 47 | 37 | 23 | ○ | ○ | ○ |
| Comparative Example | 1 | 200 | " | " | Low Temp. | 0.005 | 95 | 45 | X | X | X |
| | 2 | 200 | " | " | High Temp. | 80 | 25 | 17 | ○ | ○ | X |
| | 3 | 200 | No heat treatment | | Standard | 49 | 93 | 43 | ○ | ○ | X |
| | 4 | 200 | Standard | Slow cooling | " | 33 | 28 | 22 | ○ | ○ | X |

The results are shown in Table 1. Values outside the range of the present invention are underlined.

All of Working Example Nos. 1 to 9 had the average crystal grain size and the crystal orientation <111> proportion of the wire being within the range of the present invention, and favorable hardness of the wire. They achieved favorable results in all of bonding property, chip crack, and reliability test. As described above, for Working Examples 1 to 9, the temperature of the thermal refining heat proportion was below the lower limit. The result of the reliability test was unsatisfactory.

Implementation Example 2

There were manufactured Al bonding wires with the wire components shown in Table 2 and a wire diameter of 200 μm. The manufacturing condition and the evaluation items were the same with those in Implementation Example 1 described above. The results are shown in Table 2.

TABLE 2

| | | Wire Texture | | Wire Properties | | |
|---|---|---|---|---|---|---|
| | Wire | Crystal | Crystal orientation <111> | | | |
| | Component (% by mass) | grain size (μm) | proportion (%) | Hardness Hv | Bonding property | Chip crack | Reliability test |
| Working Example | 10 pure Al | 22 | 63 | 24 | ○ | ○ | ○ |
| | 11 Al + 0.5% Fe | 10 | 72 | 27 | ○ | ○ | ◎ |
| | 12 Al + 1% Si | 8 | 74 | 28 | ○ | ○ | ◎ |

As is apparent from Table 2, any wire component could be used to form the wire texture of the present invention and achieve good wire properties.

The invention claimed is:

1. A bonding wire of Al or Al alloy, wherein
an average crystal grain size in a cross-section in a direction perpendicular to a wire axis of the bonding wire is 0.01 to 50 μm,
a hardness of the wire is 20 to 40 in terms of Hv, and
when measuring crystal orientations on the cross-section in the direction perpendicular to the wire axis of the bonding wire, a crystal orientation <111> angled at 15 degrees or less to a wire longitudinal direction has a proportion of 30 to 90% among crystal orientations in the wire longitudinal direction.

2. The bonding wire according to claim 1, wherein a wire diameter is 50 to 600 μm.

* * * * *